(12) United States Patent
Wang (10) Patent No.: US 9,564,204 B2
(45) Date of Patent: Feb. 7, 2017

(54) MULTI-CHIP PACKAGE AND OPERATING METHOD THEREOF

(71) Applicant: SK hynix Inc., Gyeonggi-do (KR)

(72) Inventor: Jong-Hyun Wang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/963,972

(22) Filed: Dec. 9, 2015

(65) Prior Publication Data

US 2016/0372175 A1    Dec. 22, 2016

(30) Foreign Application Priority Data

Jun. 19, 2015    (KR) .................. 10-2015-0087406

(51) Int. Cl.
*G11C 8/12*         (2006.01)
*G11C 11/4076*   (2006.01)

(52) U.S. Cl.
CPC ............................ *G11C 11/4076* (2013.01)

(58) Field of Classification Search
CPC ....................................................... G11C 8/12
USPC ................................................... 365/189.17
See application file for complete search history.

(56) References Cited

U.S. PATENT DOCUMENTS

| 2006/0118965 A1* | 6/2006 | Matsui ............... H01L 23/481 257/774 |
| 2012/0235142 A1* | 9/2012 | Song .................... H01L 25/167 257/48 |
| 2014/0208156 A1* | 7/2014 | Muralimanohar ....... G11C 5/04 714/6.24 |
| 2015/0162068 A1* | 6/2015 | Woo .................. G11C 11/40615 365/222 |

FOREIGN PATENT DOCUMENTS

KR    1019980083753    12/1998

* cited by examiner

*Primary Examiner* — Min Huang
(74) *Attorney, Agent, or Firm* — IP & T Group LLP (57) ABSTRACT

A multi-chip package includes a plurality of semiconductor devices each having an address which is designated based on unique values corresponding to the respective semiconductor devices; and a controller suitable for activating each of the semiconductor devices based on the address, and controlling the activated semiconductor device to perform a normal operation.

17 Claims, 7 Drawing Sheets

MULTI-CHIP PACKAGE AND OPERATING METHOD THEREOF

CROSS-REFERENCE TO RELATED APPLICATIONS

The present application claims priority of Korean Patent Application No. 10-2015-0087406, filed on Jun. 19, 2015, which is incorporated herein by reference in its entirety.

BACKGROUND

1. Field

Exemplary embodiments of the present invention relate to semiconductor design technology, and more particularly, to a multi-chip package including a plurality of semiconductor devices.

2. Description of the Related Art

In general, semiconductor devices such as double data rate synchronous DRAM (DDR SDRAM) have developed in various ways (e.g., a package technology) to satisfy users' needs. Recently, a multi-chip package has been suggested as the package technology for semiconductor devices. The multi-chip package refers to a single apparatus including a plurality of semiconductor devices (i.e., chips or dies). The multi-chip package may increase a memory capacity using a plurality of memory devices with a memory function and secure desired performance using semiconductor devices with different functions. For reference, the multi-chip package may be a single-layer multi-chip package or a multilayer multi-chip package. The single-layer multi-chip package includes a plurality of semiconductor devices arranged in parallel on the plane, and the multilayer multi-chip package may include a plurality of semiconductor devices stacked therein.

Conventionally, when a plurality of semiconductor chips are implemented as a multilayer multi-chip package, input/output terminals of semiconductor devices are wire-bonded. However, when wire bonding is used, the multi-chip package may not satisfy a high-speed operation and may be vulnerable to various noises. Thus, through-silicon via (TSV) technology has been recently used in place of the wire bonding.

The multi-chip package may be implemented as a double-die package (DDP), quad-die package (QDP), or octo-die package (ODP). A DDP represents operation of two semiconductor devices, QDP represents operation of four semiconductor devices, and ODP represents operation of eight semiconductor. In each of DDP, QDP, and ODP, before a normal operation is performed, an address must be designated for each of the semiconductor devices in the multi-chip package.

Figure 1:
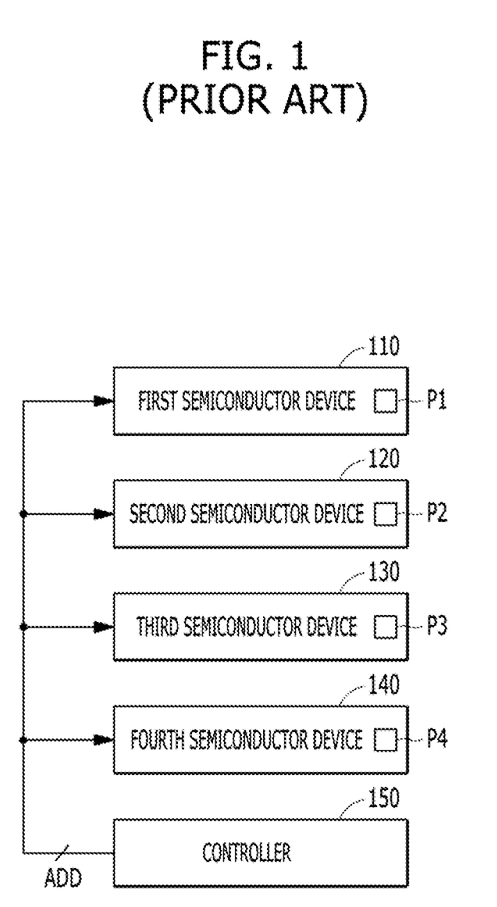
FIG. 1 is a block diagram illustrating a prior art conventional multi-chip package.

FIG. 1 is a block diagram illustrating a conventional multi-chip package. A multi-chip package in which DDP and QDP operations are available will be taken as an example.

Referring to FIG. 1, the multi-chip package includes first to fourth semiconductor devices 110 to 140 and a controller 150.

The first to fourth semiconductor devices 110 to 140 may be activated in response to an address signal ADD generated by the controller 150. Among the first to fourth semiconductor devices 110 to 140, an activated semiconductor device performs a normal operation corresponding to a command signal (not illustrated). Thus, an order for addressing the semiconductor devices 110 to 140 is to be set. Conventionally, to set the order for addressing, option pads are used. The respective semiconductor devices 110 to 140 include option pad units P1 to P4. Then, according to settings of the option pad units P1 to P4, the order for addressing the first to fourth semiconductor devices 110 to 140, the controller 150 may activate a semiconductor device corresponding to the address signal ADD, and perform a normal operation.

As illustrated in FIG. 1, at least two option pads are required for the respective semiconductor devices 110 to 140. For example, in the configuration for ODP operation, at least three option pads are required for each semiconductor device. Recently, with the developments in process technology and design technology of semiconductor devices, the number of stacked semiconductor devices has gradually increased. As the number of the stacked semiconductor devices increases, the number of option pads also increases. The increase in the number of option pads may serve as a factor which increases the size and cost of the multi-chip package.

SUMMARY

Various embodiments are directed to a multi-chip package capable of designating an addressing order for a plurality of semiconductor devices included therein, using unique values obtained from the respective semiconductor devices.

In an embodiment, a multi-chip package may include a plurality of semiconductor devices each having an address which is designated based on unique values corresponding to the respective semiconductor devices; and a controller suitable for activating each of the semiconductor devices based on the address, and controlling the activated semiconductor device to perform a normal operation.

The unique values may include coordinate values on a wafer, which is designated when a process for fabricating the semiconductor devices is performed.

Each of the semiconductor devices may include a coordinate value storage unit suitable for storing a coordinate value of the corresponding semiconductor device; an address comparison unit suitable for comparing the coordinate value to an address signal outputted from the controller; and a control unit suitable for activating the corresponding semiconductor device in response to an output signal of the comparison unit.

The plurality of semiconductor devices may be processed on a single wafer.

The plurality of semiconductor devices may be processed on more than one wafer.

The plurality of semiconductor devices and the controller may be stacked.

In an embodiment, a multi-chip package may include a plurality of semiconductor devices; and a controller suitable for activating each of the semiconductor devices based on an address signal, and controlling the activated semiconductor device to perform a normal operation, wherein each of the semiconductor devices may include a coordinate value storage unit suitable for storing a corresponding coordinate value on a wafer, which is designated when a process for fabricating the semiconductor devices is performed; a counting value comparison unit suitable for comparing the corresponding coordinate value and a counting value which is sequentially counted; and an address storage unit suitable for storing an address provided from the controller, and wherein the controller generates the address based on output signals of counting value comparison units of the respective semiconductor devices.

Each of the semiconductor devices may further include an input unit suitable for receiving the address in response to a corresponding output signal of the counting value comparison unit, and providing the received address to the address storage unit; an address comparison unit suitable for comparing the address and an address signal outputted from the controller; and a control unit suitable for activating the semiconductor device based on an output signal of the address comparison unit.

The controller may comprise a counting unit suitable for providing the counting value to the plurality of semiconductor devices during an address setting operation.

The plurality of semiconductor devices may be processed on a single wafer.

The plurality of semiconductor devices may be processed on more than one wafer.

The plurality of semiconductor devices and the controller may be stacked.

In an embodiment, an operating method of a multi-chip package may include determining an address designation sequence based on unique values of a plurality of semiconductor devices; designating an address for each of the semiconductor devices based on the address designation sequence; storing the address designated for each of the semiconductor devices; and performing a normal operation by controlling activation operations of the semiconductor devices based on the designated address.

The unique values may comprise coordinate values on a wafer during a process, which is designated when a process for fabricating the semiconductor devices is performed.

The determining of the address designation sequence may include generating a counting value corresponding to a corresponding unique value; comparing the corresponding unique value to the counting value; and generating an indication signal corresponding to each of the semiconductor devices in response to an output signal of the comparing of the corresponding unique value to the counting value.

The designating of the address for each of the semiconductor devices may include generating the address; and providing the address to the semiconductor device corresponding to the indication signal among the plurality of semiconductor devices.

The plurality of semiconductor devices may be processed on one wafer.

The plurality of semiconductor devices may be processed on more than one wafer.

The plurality of semiconductor devices and the controller may be stacked.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
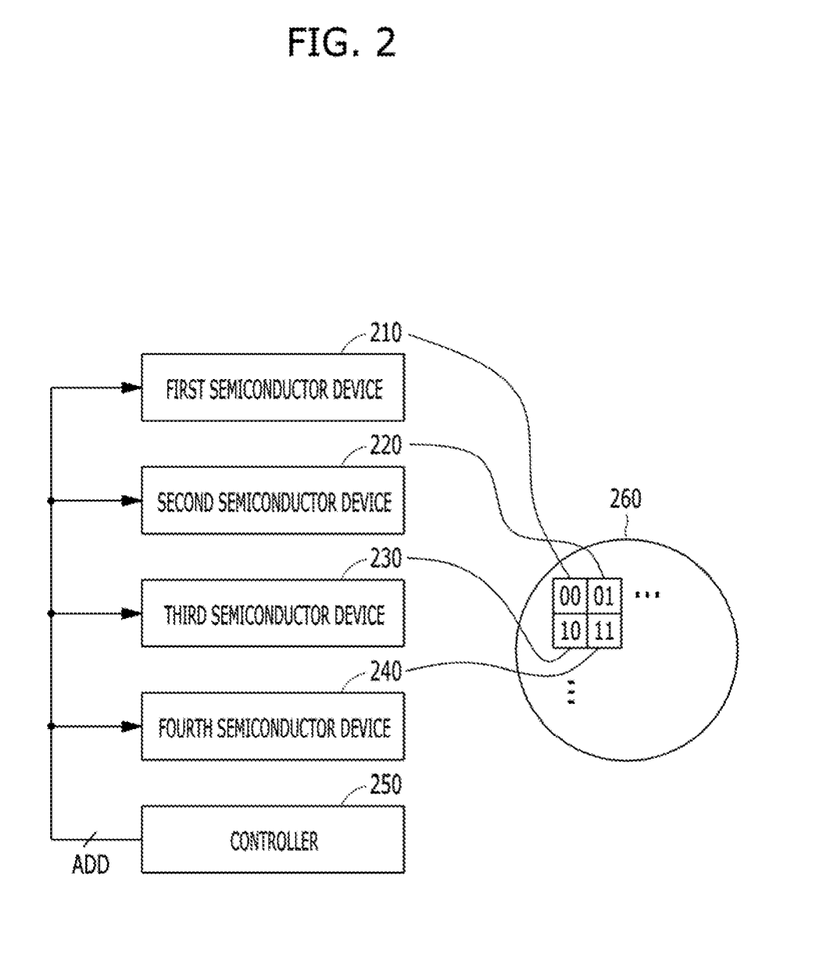
FIG. 2 is a block diagram illustrating a multi-chip package in accordance with an embodiment of the present invention.

FIG. 2 is a block diagram illustrating a multi-chip package in accordance with an embodiment of the present invention.

Referring to FIG. 2, the multi-chip package may include first to fourth semiconductor devices 210 to 240 and a controller 250.

The first to fourth semiconductor devices 210 to 240 and the controller 250 may be stacked in the multi-chip package. The first to fourth semiconductor devices 210 to 240 may be activated in response to an address signal ADD generated by the controller 250. Among the first to fourth semiconductor devices 210 to 240, an activated semiconductor device may perform a normal operation according to a command signal (not illustrated). At this time, addresses need to be designated for the first to fourth semiconductor devices 210 to 240, respectively, before a normal operation is performed by the controller 250.

The first to fourth semiconductor devices 210 to 240 may be processed on one wafer 260. In this case, the first to fourth semiconductor devices 210 to 240 may have coordinate values. For example, the first semiconductor device 210 has a coordinate value of '00', the second semiconductor device 220 has a coordinate value of '01', the third semiconductor device 230 has a coordinate value of '10', and the fourth semiconductor device 240 has a coordinate value of '11'. Although described below with reference to FIG. 3, the first to fourth semiconductor devices 210 to 240 may include storage circuits for storing the respective coordinate values. The coordinate values may be set to the respective addresses of the first to fourth semiconductor devices 210 to 240.

When the process is performed on one wafer 260, the plurality of semiconductor devices processed on the wafer 260 may have different coordinate values from each other. The coordinate values may be set to the unique values of the respective semiconductor devices, and used for distinguishing the plurality of semiconductor devices from each other. That is, the coordinate values may be used as the addresses of the first to fourth semiconductor devices 210 to 240. Then, when the addresses (or an addressing order) are designated for the first to fourth semiconductor devices 210 to 240 through the above-described method, the controller 250 may activate each of the first to fourth semiconductor devices 210 to 240 according to the address signal ADD and the addresses designated for the first to fourth semiconductor devices 210 to 240, respectively, and control the activated semiconductor device to perform a normal operation.

The multi-chip package in accordance with the embodiment of the present invention may set addresses (i.e., set an addressing order) using the coordinate values on the wafer.

In the embodiment of FIG. 2, the case in which the first to fourth semiconductor devices 210 to 240 are processed on one wafer 260 has been taken as an example. However, when the first to fourth semiconductor devices 210 to 240 are processed through different equipment or processed under different environment conditions (e.g., when the first to fourth semiconductor devices 210 to 240 are processed on different wafers or more than one wafer), the first to fourth semiconductor devices 210 to 240 may be controlled to have different unique values. For example, the unique values which are changed through such an operation may include the characteristics of MOS transistors. When MOS transistors included in the first to fourth semiconductor devices 210 to 240 have different characteristics, the characteristics may be set to the unique values and then used for setting the addressing order of the first to fourth semiconductor devices 210 to 240.

Figure 3:
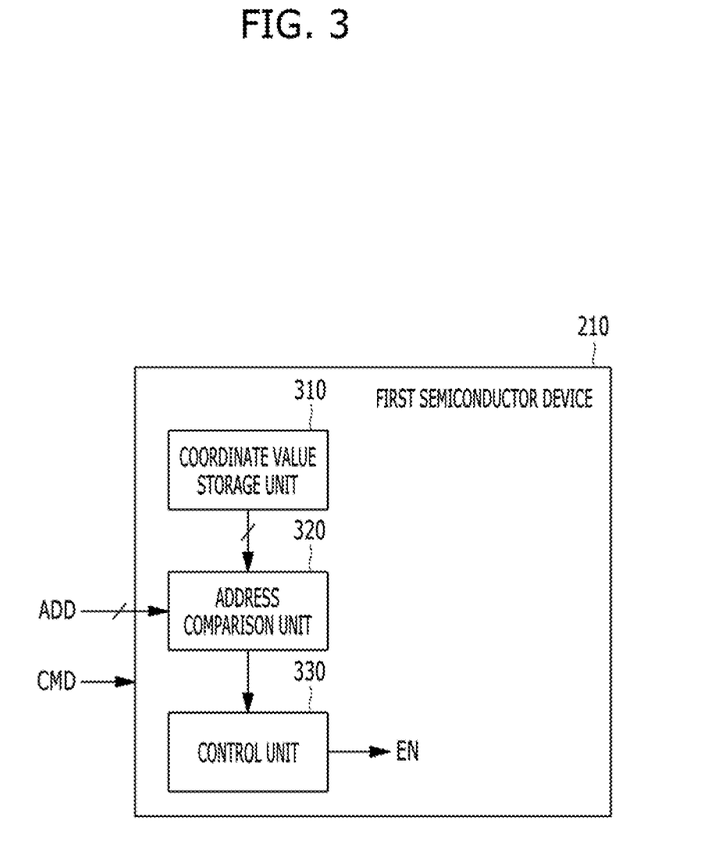
FIG. 3 is a detailed diagram of a first semiconductor device illustrated in FIG. 2.

FIG. 3 is a detailed diagram of the first semiconductor device 210 illustrated in FIG. 2.

Referring to FIG. 3, the first semiconductor device 210 may include a coordinate value storage unit 310, an address comparison unit 320, and a control unit 330.

The coordinate value storage unit 310 may serve to store coordinate values on the wafer. Referring to FIG. 2, a coordinate value of '00' may be stored in the coordinate value storage unit 310 of the first semiconductor device 210.

The address comparison unit 320 may compare the coordinate value stored in the coordinate value storage unit 310 to the address signal ADD, and output the result value. When the address signal ADD is '00', the address comparison unit 320 may output a signal indicating that the coordinate value of '00' is equal to the address signal ADD of '00'.

The control unit 330 may generate an enable signal in response to the output signal of the address comparison unit 320. Thus, when the coordinate value and the address signal ADD are equal to each other and the enable signal EN transitions to a predetermined level, the first semiconductor device 210 may be activated to perform a normal operation according to a command signal CMD.

The multi-chip package in accordance with the embodiment of the present invention may activate a semiconductor device according to the address signal ADD and the coordinate value of the semiconductor device, and control the semiconductor device to perform a normal operation.

In above embodiment, it has been described that the coordinate values on the wafer are stored in the respective semiconductor devices and then used as addresses. Hereafter, the case in which the coordinate values of the respective semiconductor devices are replaced with consecutive numbers as illustrated in FIG. 4 will be taken as an example.

Figure 4:
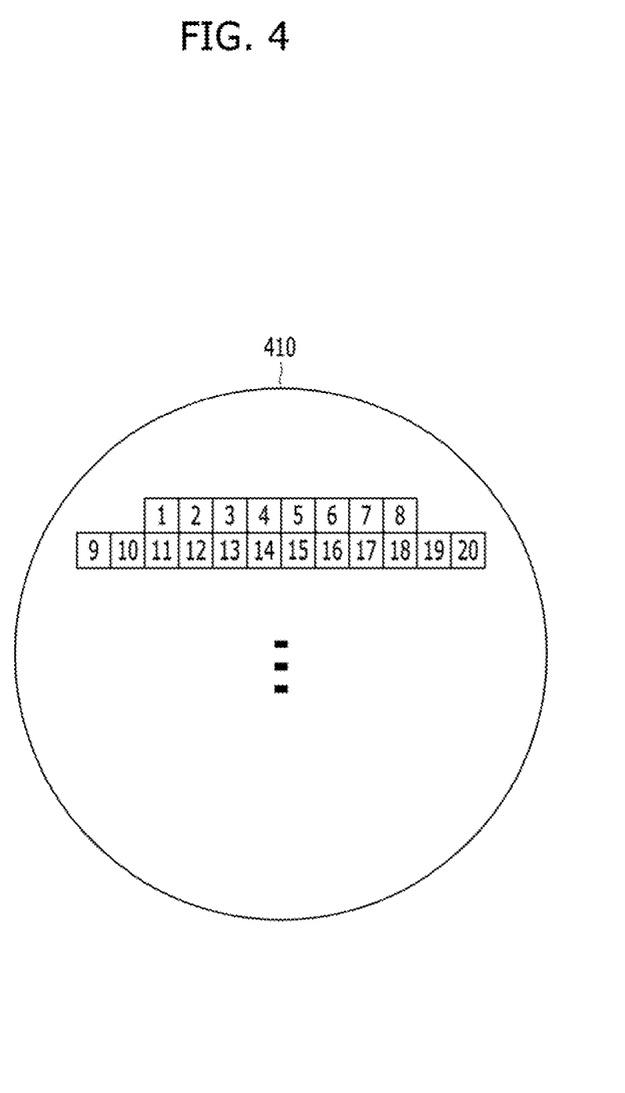
FIG. 4 is a diagram for describing numbers allocated to a plurality of semiconductor devices formed on one wafer.

FIG. 4 is a diagram for describing numbers allocated to a plurality of semiconductor devices formed on one wafer.

As illustrated in FIG. 4, numbers may be allocated to the respective semiconductor devices. As described above, the numbers may be stored in the storage circuits provided in the respective semiconductor devices, like the coordinate values. FIG. 4 illustrates the plurality of semiconductor devices to which the numbers of 1 to 20 are allocated. The configuration may be changed according to the number of semiconductor devices formed in the multi-chip package.

When a multi-chip package is formed, a plurality of semiconductor devices may be used. The plurality of semiconductor devices used at this time may be randomly used as a part of the plurality of semiconductor devices illustrated in FIG. 4. That is, when four semiconductor devices are formed in the multi-chip package, four semiconductor devices may be randomly selected from the plurality of semiconductor devices of FIG. 4. This configuration will be described below with reference to FIG. 5.

Figure 5:
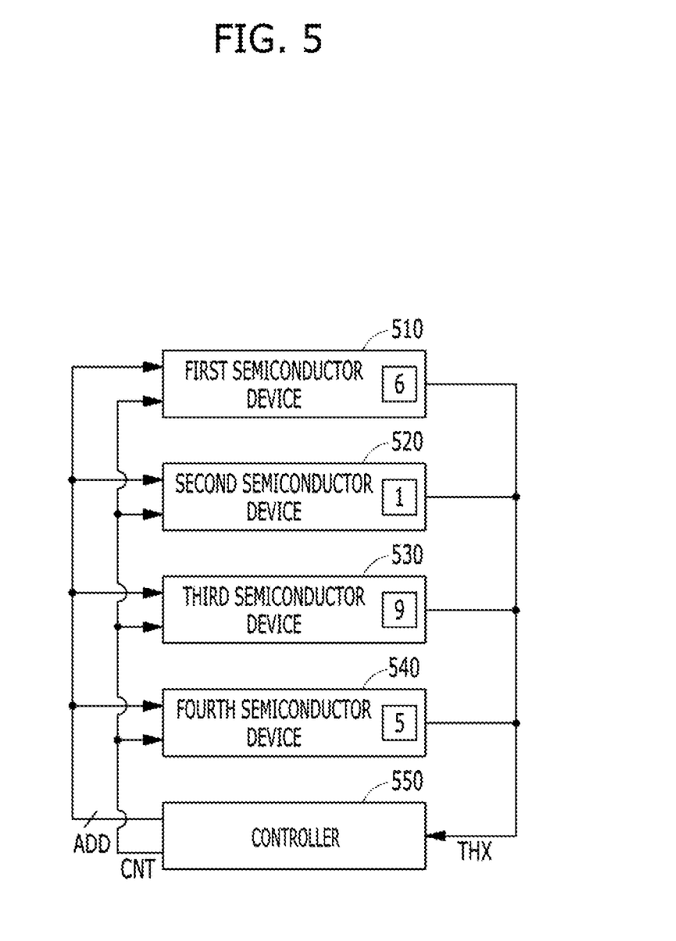
FIG. 5 is a block diagram illustrating a multi-chip package in accordance with an embodiment of the present invention.

FIG. 5 is a block diagram illustrating a multi-chip package in accordance with an embodiment of the present invention.

Referring to FIG. 5, the multi-chip package may include first to fourth semiconductor devices 510 to 540 and a controller 550. As an example, a coordinate value of '6' is allocated to the first semiconductor device 510, a coordinate value of '1' is allocated to the second semiconductor device 520, a coordinate value of '9' is allocated to the third semiconductor device 530, and a coordinate value of '5' is allocated to the fourth semiconductor device 540.

Hereafter, a circuit operation will be described.

First, the multi-chip package may include an operation for setting an addressing order of the first to fourth semiconductor devices 510 to 540. Hereafter, the operation will be referred to as an address setting operation. The address setting operation may be divided into an operation of determining the sequence in which addresses are designated and an operation of setting addresses according to the sequence.

During the address setting operation, a counting value CNT provided from the controller 550 may be sequentially counted. The counting value CNT may be provided to all of the first to fourth semiconductor devices 510 to 540. For reference, the first to fourth semiconductor devices 510 to 540 may be coupled through TSVs (Through Silicon Vias), and the counting value CNT, an address signal ADD, and an indication signal THX may be transmitted through the TSVs. FIG. 5 illustrates that the address signal ADD, the counting value CNT, and the indication signal THX are not electrically coupled to each other. However, when the times at which the address signal ADD, the counting value CNT, and the indication signal THX are transmitted are different from each other, the multi-chip package may be designed to use one TSV.

Each of the first to fourth semiconductor devices 510 to 540 may receive the counting value CNT, compare the received counting value CNT to the coordinate value, and generate the indication signal THX. The configuration of the first to fourth semiconductor devices 510 to 540 will be described below with reference to FIG. 6. The controller 550 may generate address signals ADD which are to be designated for the first to fourth semiconductor devices 510 to 540, respectively, in response to the indication signals THX. For example, suppose that the counting value CNT is a signal increasing from 1 by '+1'. In this case, the indication signals THX will be sequentially generated in order of the second semiconductor device 520→the fourth semiconductor device 540→the first semiconductor device 510→the third semiconductor device 530. This operation may indicate the operation of determining the sequence in which addresses are designated.

Furthermore, suppose that the controller 550 designates addresses for the first to fourth semiconductor devices 510 to 540 from the address having the lowest value (e.g., according to the determined address designation sequence). In this case, an address of '00' may be designated for the second semiconductor device 520, an address of '01' may be designated for the fourth semiconductor device 540, an address of '10' may be designated for the first semiconductor device 510, and an address of '11' may be designated for the third semiconductor device 530. This operation may indicate the operation of designating the addresses.

When the address designation sequence is determined and the addresses are designated according to the address designation sequence, the addresses may be set to all of the first to fourth semiconductor devices 510 to 540. Then, according to the addressing order set to the first to fourth semiconductor devices 510 to 540 and the address signals ADD, the controller 550 may activate the first to fourth semiconductor devices 510 to 540 to perform a normal operation.

The multi-chip package in accordance with the embodiment of the present invention may designate addresses for the first to fourth semiconductor devices 510 to 540 using the counting value CNT and the coordinate values during the address setting operation.

Figure 6:
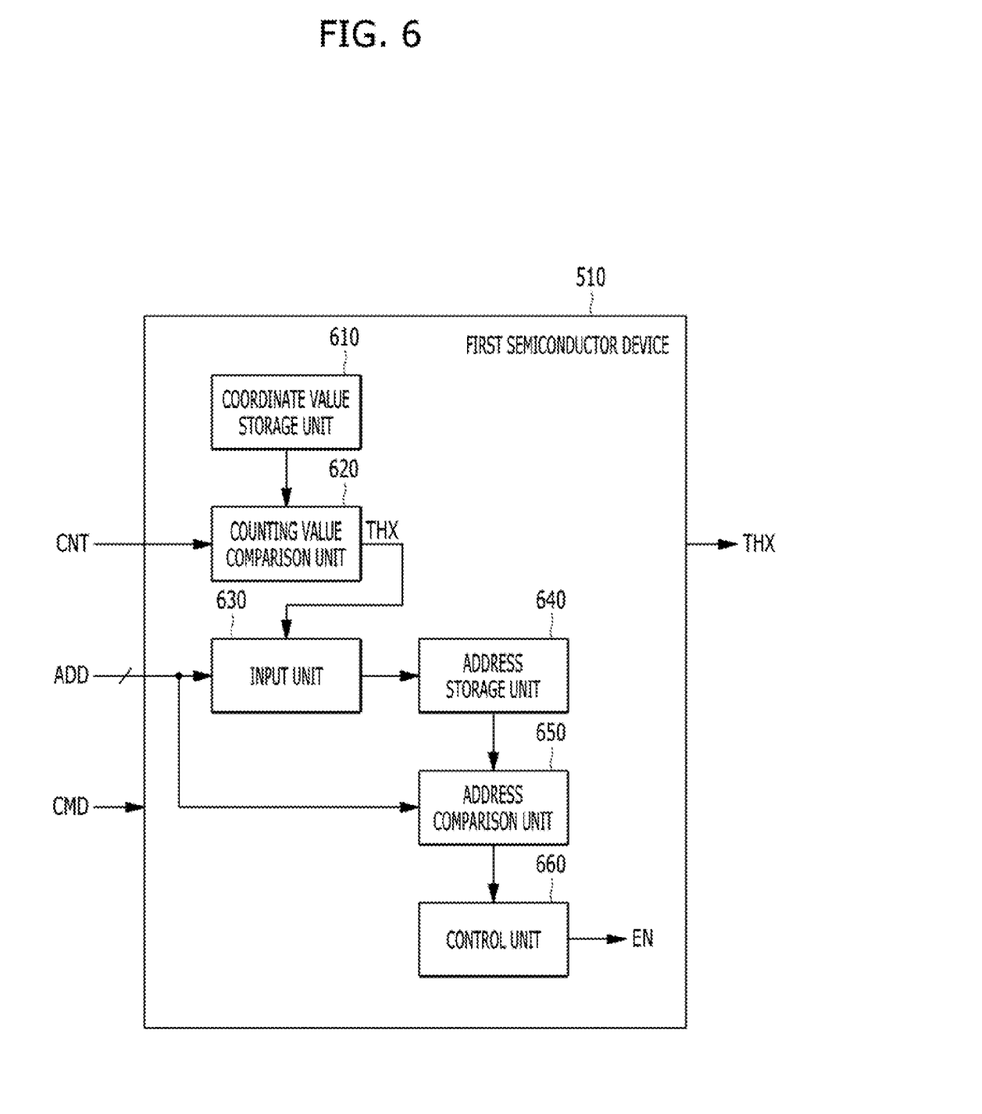
FIG. 6 is a detailed diagram of a first semiconductor device illustrated in FIG. 5.

FIG. 6 is a detailed diagram of the first semiconductor device 510 illustrated in FIG. 5.

Referring to FIG. 6, the first semiconductor device 510 may include a coordinate value storage unit 610, a counting value comparison unit 620, an input unit 630, an address storage unit 640, an address comparison unit 650, and a control unit 660.

The coordinate value storage unit 610 may store coordinate values on the wafer. In FIG. 5, suppose that the first semiconductor device 510 stores a coordinate value of '6'. This may indicate that '6' is stored in the coordinate value storage unit 610.

The counting value comparison unit 620 may compare the coordinate value stored in the coordinate value storage unit 610 to the counting value CNT, and generate the indication signal THX. In the case of the first semiconductor device 510, '6' is stored in the coordinate value storage unit 610. Thus, when the counting value CNT becomes '6', the indication signal THX may be activated.

The input unit 630 may receive the address signal ADD in response to the indication signal THX, and provide the received address signal ADD to the address storage unit 640. The input unit 630 may block the address signal ADD before the indication signal THX is activated, and pass the address signal ADD when the indication signal THX is activated. In the structure in which the first to fourth semiconductor devices 510 to 540 of FIG. 5 receive the address signal ADD through one TSV, the address signal ADD may be transmitted only to a semiconductor device in which the indication signal THX is activated. The address signal ADD may be generated during the address setting operation.

The address storage unit 640 may receive the address signal ADD inputted through the input unit 630 and store the received address signal ADD. According to the configuration of FIG. 5, the address signal ADD may be set to an address of '10', and the address storage unit 640 may store the address. Thus, the address of '10' may be finally set to the first semiconductor device 510.

The address comparison unit 650 may compare the address stored in the address storage unit 640 to the address signal ADD, and output the result value. The address comparison unit 650 and the control unit 660 to be described below may correspond to a normal operation. When the address signal ADD is '10' during a normal operation, the address comparison unit 650 may output a signal indicating that the address of '10', designated for the first semiconductor device 510, is equal to the address signal ADD of '10'.

The control unit 660 may generate an enable signal EN in response to the output signal of the address comparison unit 650. Thus, when the address designated for the first semiconductor device 510 is equal to the address signal ADD and the enable signal EN transitions to a predetermined level, the first semiconductor device 510 may be activated to perform a normal operation according to the command signal CMD.

Figure 7:
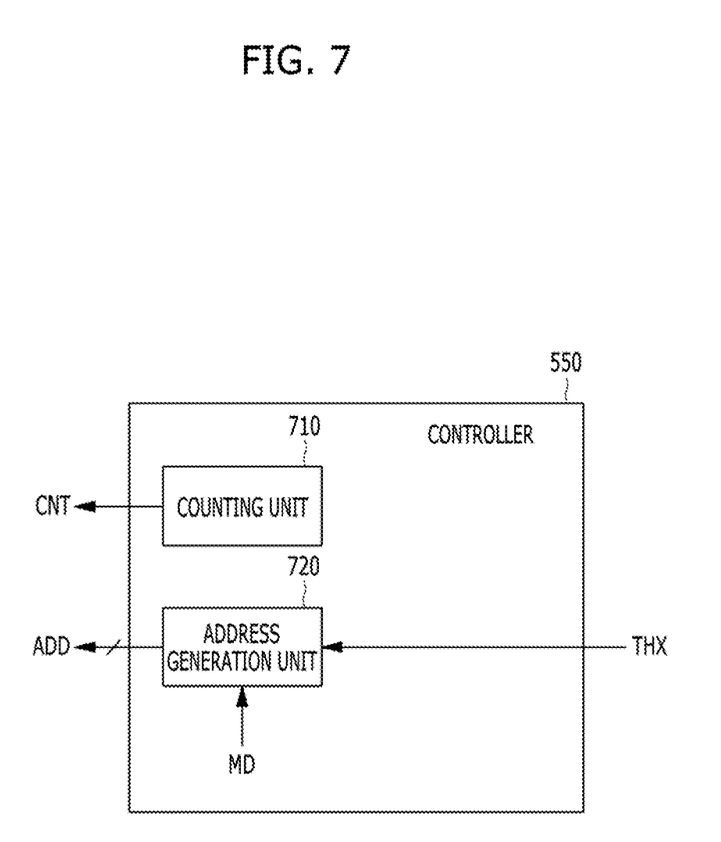
FIG. 7 is a detailed diagram of a controller illustrated in FIG. 5.

FIG. 7 is a detailed diagram of the controller 550 illustrated in FIG. 5.

Referring to FIG. 7, the controller 550 may include a counting unit 710 and an address generation unit 720.

The counting unit 710 may generate a counting value CNT. During the address setting operation, the counting unit 710 may generate the counting value CNT which is sequentially counted, and provide the generated counting value CNT to the first to fourth semiconductor devices 510 to 540 of FIG. 5.

The address generation unit 720 may generate an address signal ADD during the address setting operation and a normal operation. Thus, during the address setting operation, the address generation unit 720 may generate an address signal ADD which is sequentially controlled in order of '00'→'01'→'10'→'11', in response to the indication signal THX. During a normal operation, the address generation unit 720 may generate the address signal ADD for selectively activating the first to fourth semiconductor devices 510 to 540 of FIG. 5 and controlling the activated semiconductor device to perform the normal operation. The address generation unit 720 may generate the address signal ADD corresponding to the address setting operation or the normal operation in response to the operation control signal MD.

Hereafter, a circuit operation will be described with reference to FIG. 5 to 7.

First, the coordinate value storage unit 610 of the first semiconductor device 510 may store a coordinate value of '6'. During the address setting operation, the counting unit 710 of the controller 550 may generate a counting value CNT which is sequentially counted. The counting value CNT may be provided to the first to fourth semiconductor devices 510 to 540 of FIG. 5. When the counting value CNT is '1', the second semiconductor device 520 may generate the indication signal THX. Thus, the address generation unit 720 of the controller 550 may generate an address signal ADD of '00'. At this time, the input unit of the second semiconductor device 520 may be activated, and the address signal of '00' may be stored in the address storage unit of the second semiconductor device 520. Through the series of operations, the address of '00' may be set to the second semiconductor device 520.

Through such an address setting operation, an address signal ADD of '01' may be set to the fourth semiconductor device 540 having a coordinate value of '5', an address signal ADD of '10' may be set to the first semiconductor device 510 having a coordinate value of '6', and an address signal ADD of '11' may be set to the third semiconductor device 530 having a coordinate value of '9'. Finally, through such an operation, the corresponding addresses may be set to the first to fourth semiconductor devices 510 to 540. Then, according to the addresses set to the first to fourth semiconductor devices 510 to 540 and the address signal ADD, the controller 550 may activate a corresponding semiconductor device among the first to fourth semiconductor devices 510 to 540, and control the activated semiconductor device to perform a normal operation.

The multi-chip package in accordance with the embodiment of the present invention may perform the address setting operation using the coordinate value and the counting value. As illustrated in FIG. 5, separate option pads may be excluded from each semiconductor memory device.

As described above, the multi-chip package in accordance with the embodiment of the present invention may designate addresses for the plurality of semiconductor devices according to the unique values of the respective semiconductor devices, and perform a circuit operation according to the designated addresses.

In accordance with the embodiments of the present invention, since separate pads are not needed when addresses are designated for the plurality of semiconductor devices, the size of the multi-chip package may be reduced.

Although various embodiments have been described for illustrative purposes, it will be apparent to those skilled in the art that various changes and modifications may be made without departing from the spirit and scope of the invention as defined in the following claims.

What is claimed is:

1. A multi-chip package comprising:
a plurality of semiconductor devices each having an address which is designated based on unique values corresponding to the respective semiconductor devices; and
a controller suitable for activating each of the semiconductor devices based on the address, and controlling the activated semiconductor device to perform a normal operation,
wherein each of the semiconductor devices comprises:
a coordinate value storage unit suitable for storing a coordinate value of the corresponding semiconductor device;
an address comparison unit suitable for comparing the coordinate value to an address signal outputted from the controller; and
a control unit suitable for activating the corresponding semiconductor device in response to an output signal of the comparison unit.

2. The multi-chip package of claim 1, wherein the unique values include coordinate values on a wafer, which is designated when a process for fabricating the semiconductor devices is performed.

3. The multi-chip package of claim 1, wherein the plurality of semiconductor devices are processed on a single wafer.

4. The multi-chip package of claim 1, wherein the plurality of semiconductor devices are processed on more than one wafer.

5. The multi-chip package of claim 1, wherein the plurality of semiconductor devices and the controller are stacked.

6. A multi-chip package comprising:
a plurality of semiconductor devices; and
a controller suitable for activating each of the semiconductor devices based on an address signal, and controlling the activated semiconductor device to perform a normal operation,
wherein each of the semiconductor devices includes:
a coordinate value storage unit suitable for storing a corresponding coordinate value on a wafer, which is designated when a process for fabricating the semiconductor devices is performed;
a counting value comparison unit suitable for comparing the corresponding coordinate value and a counting value which is sequentially counted; and
an address storage unit suitable for storing an address provided from the controller, and
wherein the controller generates the address based on output signals of counting value comparison units of the respective semiconductor devices.

7. The multi-chip package of claim 6, wherein each of the semiconductor devices further comprises:
an input unit suitable for receiving the address in response to a corresponding output signal of the counting value comparison unit, and providing the received address to the address storage unit;
an address comparison unit suitable for comparing the address and an address signal outputted from the controller; and
a control unit suitable for activating the semiconductor device based on an output signal of the address comparison unit.

8. The multi-chip package of claim 6, wherein the controller comprises a counting unit suitable for providing the counting value to the plurality of semiconductor devices during an address setting operation.

9. The multi-chip package of claim 6, wherein the plurality of semiconductor devices are processed on a single wafer.

10. The multi-chip package of claim 6, wherein the plurality of semiconductor devices are processed on more than one wafer.

11. The multi-chip package of claim 6, wherein the plurality of semiconductor devices and the controller are stacked.

12. An operating method of a multi-chip package, comprising:
determining an address designation sequence based on unique values of a plurality of semiconductor devices;
designating an address for each of the semiconductor devices based on the address designation sequence;
storing the address designated for each of the semiconductor devices; and
performing a normal operation by controlling activation operations of the semiconductor devices based on the designated address,
wherein the determining of the address designation sequence comprises:
generating a counting value corresponding to a corresponding unique value;
comparing the corresponding unique value to the counting value; and
generating an indication signal corresponding to each of the semiconductor devices in response to an output signal of the comparing of the corresponding unique value to the counting value.

13. The operating method of claim 12, wherein the unique values comprise coordinate values on a wafer during a process, which is designated when a process for fabricating the semiconductor devices is performed.

14. The operating method of claim 12, wherein the designating of the address for each of the semiconductor devices comprises:
generating the address; and
providing the address to the semiconductor device corresponding to the indication signal among the plurality of semiconductor devices.

15. The operating method of claim 12, wherein the plurality of semiconductor devices are processed on one wafer.

16. The operating method of claim 12, wherein the plurality of semiconductor devices are processed on more than one wafer.

17. The operating method of claim 12, wherein the plurality of semiconductor devices and the controller are stacked.

* * * * *